United States Patent
Chen et al.

(10) Patent No.: US 7,073,568 B2
(45) Date of Patent: Jul. 11, 2006

(54) HEAT DISSIPATION DEVICE

(75) Inventors: Chun-Chi Chen, Tu-Cheng (TW); Yi-Qiang Wu, Shenzhen (CN)

(73) Assignee: HON HAI Precision Industry Co., Ltd., Tu-cheng (TW)

( * ) Notice: Subject to any disclaimer, the term of this patent is extended or adjusted under 35 U.S.C. 154(b) by 0 days.

(21) Appl. No.: 10/977,857

(22) Filed: Oct. 29, 2004

(65) Prior Publication Data

US 2005/0139347 A1 Jun. 30, 2005

(30) Foreign Application Priority Data

Dec. 26, 2003 (TW) ............... 92222763 U

(51) Int. Cl.
*F28D 15/00* (2006.01)

(52) U.S. Cl. .................. 165/104.33; 165/80.4; 165/104.26; 361/697; 361/700; 361/704; 174/15.2; 257/714

(58) Field of Classification Search .......... 165/104.33, 165/104.21, 104.19, 185, 80.4; 361/697, 361/699, 700; 174/15.2; 257/714–716
See application file for complete search history.

(56) References Cited

U.S. PATENT DOCUMENTS

| | | | |
|---|---|---|---|
| 5,494,098 A | | 2/1996 | Morosas |
| 5,509,465 A | * | 4/1996 | Lai ........................... 165/80.3 |
| 5,959,837 A | * | 9/1999 | Yu ............................. 361/697 |
| 6,062,301 A | | 5/2000 | Lu |
| 6,542,364 B1 | | 4/2003 | Lai et al. |
| 6,745,824 B1 | * | 6/2004 | Lee et al. ............. 165/104.14 |
| 6,779,595 B1 | * | 8/2004 | Chiang ................. 165/104.33 |
| 6,860,321 B1 | * | 3/2005 | Ji-Hai et al. ............... 165/80.3 |
| 6,909,608 B1 | * | 6/2005 | Fan ............................ 361/700 |
| 6,915,844 B1 | * | 7/2005 | Chou ..................... 165/104.33 |
| 2003/0141041 A1 | * | 7/2003 | Chen ......................... 165/80.3 |
| 2004/0226697 A1 | * | 11/2004 | Liu ....................... 165/104.33 |
| 2005/0066487 A1 | * | 3/2005 | Zhang ............................ 24/457 |
| 2005/0073811 A1 | * | 4/2005 | Wang et al. ................ 361/688 |
| 2005/0087329 A1 | * | 4/2005 | Zhang et al. .......... 165/104.33 |
| 2005/0141202 A1 | * | 6/2005 | Lee et al. .................... 361/704 |

FOREIGN PATENT DOCUMENTS

| CN | 2458733 Y | 11/2001 |
|---|---|---|
| CN | 2475069 Y | 1/2002 |
| CN | 2558081 Y | 6/2003 |

* cited by examiner

*Primary Examiner*—Terrell McKinnon
(74) *Attorney, Agent, or Firm*—Tim Tingkang Xia, Esq.; Morris, Manning & Martin

(57) ABSTRACT

A heat dissipation device includes a fin member (16), a fan (30), a fan holder (40) and at least one heat pipe (20). The fan holder includes a support plate (42) which is sandwiched between the fin member and the fan, and ears (46) perpendicularly extending from the support plate. The heat pipe includes a condensating section (26). The condensating section extends across the fin member near the support plate and is gripped by the ears.

9 Claims, 2 Drawing Sheets

HEAT DISSIPATION DEVICE

BACKGROUND OF THE INVENTION

1. Field of the Invention

The present invention relates to a heat dissipation device, and more particularly to a heat dissipation device including heat pipes and a fan cooperated with a heat sink for improving heat dissipation capability thereof.

2. Description of Related Art

Nowadays, personal computers are worldwide used and become more and more important for works, studies and lives of human. As everyone knows, a computer has a variety of electrical elements which operate quicker and quicker and generate increasing heat, especially the core element named central processing unit (CPU). The heat generated by the electrical elements adversely affects the stability of the electrical elements; even causes the electrical elements to be damaged.

Commonly, a heat sink is mounted onto an electrical element to remove heat therefrom and to thereby keep the electrical element in normal operation. Heat pipes are provided for increasing the speed of heat-conduct within the heat sink. A fan is positioned onto the heat sink for facilitating air convection. Initially, screws are inserted through holes of a fan and then are screwed between adjacent fins of a heat sink, thereby directly securing the fan to the heat sink. However, it is inconvenient and time-consuming to have the screws engaged with or disengaged from the fins. Moreover, the fins are tremendously prone to be deformed to thereby cause the screws loosen therefrom. It is too unreliable in practice to firmly mount the fan onto the heat sink all the time, especially for heat sink formed by folded fins.

To overcome the above-mentioned disadvantage, a fan holder has been developed to facilitate installation of a fan to a heat sink. The fan holder generally comprises a base between the heat sink and the fan for supporting the fan thereon, and further comprises a pair of sidewalls extending downwardly from opposite sides of the base. The sidewalls are parallel to the folded fins and sandwich the folded fins therebetween. The fan holder is secured to the heat sink by means of brazing, screws etc. Examples are shown in U.S. Pat. Nos. 5,494,098 and 6,062,301. China Patent Issued No. 2558081Y shows another kind of fan holder which is secured to the heat sink via pins extending from opposite ends of the bottom of each sidewall of the holder. The pins clasp the bottom of the heat sink after being bent inwardly. The fan holder further defines cutouts in the sidewalls for receiving heat pipes therein. Obviously, it is still inconvenient and time-consuming to secure the fan holder to the heat sink. Moreover, these fan holders are corpulent and material wasting because of the sidewalls spanning from top to bottom of opposite sides of the heat sink.

SUMMARY OF THE INVENTION

Accordingly, an object of the present invention is to provide a heat dissipation device which has a compact structure.

Another object of the present invention is to provide a heat dissipation device which is material saving.

In order to achieve the objects set out above, a heat dissipation device in accordance with a preferred embodiment of the present invention comprises a fin member, a fan, a fan holder and at least one heat pipe. The fan holder comprises a support plate which is sandwiched between the fin member and the fan, and ears perpendicularly extending from the support plate. The heat pipe comprises a condensating section. The condensating section extends across the fin member near the support plate and is gripped by the ears.

Other objects, advantages and novel features of the present invention will become more apparent from the following detailed description when taken in conjunction with the accompanying drawings, in which:

DETAILED DESCRIPTION OF THE INVENTION

Figure 1:
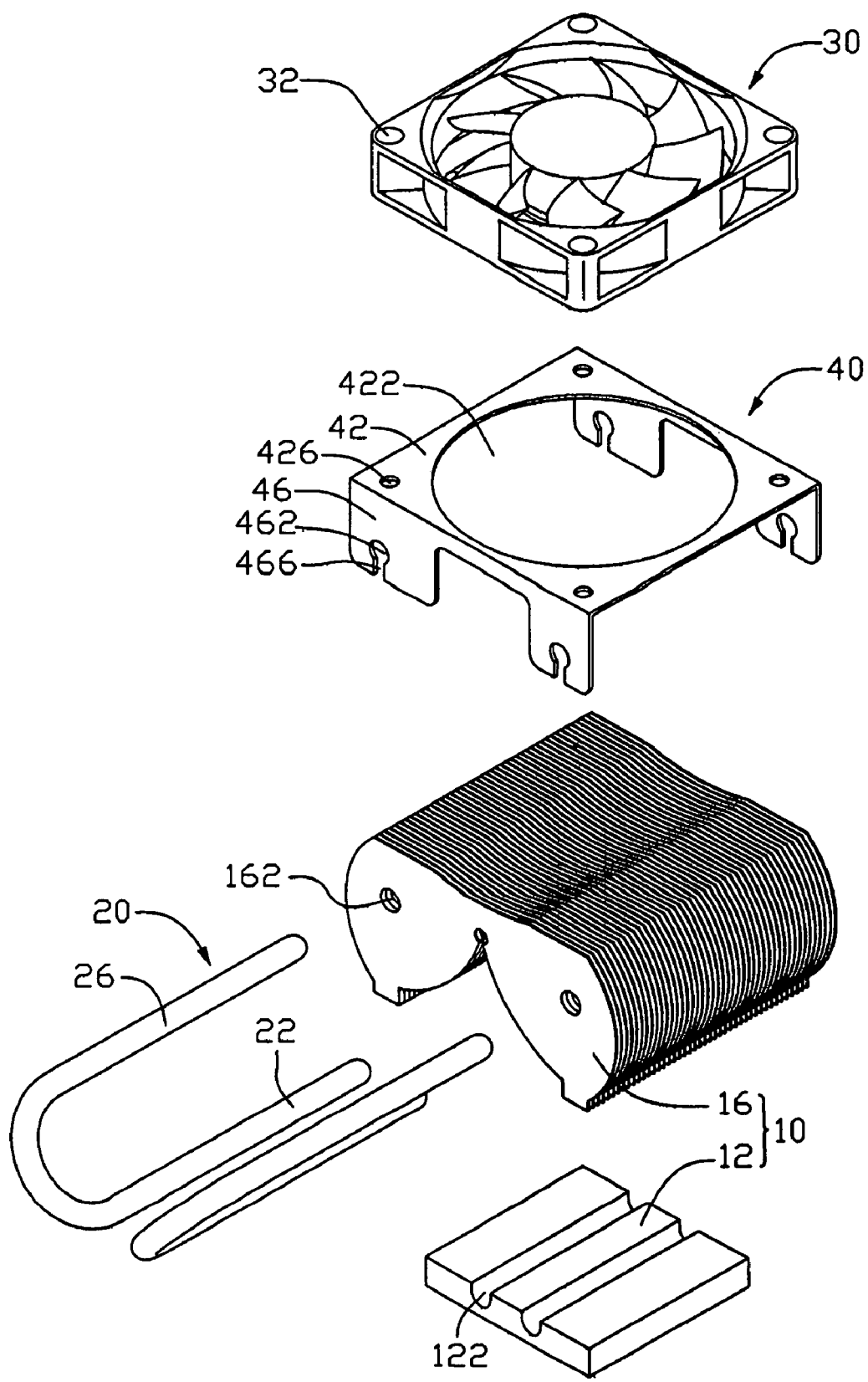
FIG. 1 is an exploded view of a heat dissipation device in accordance with a preferred embodiment of the present invention.
Figure 2:
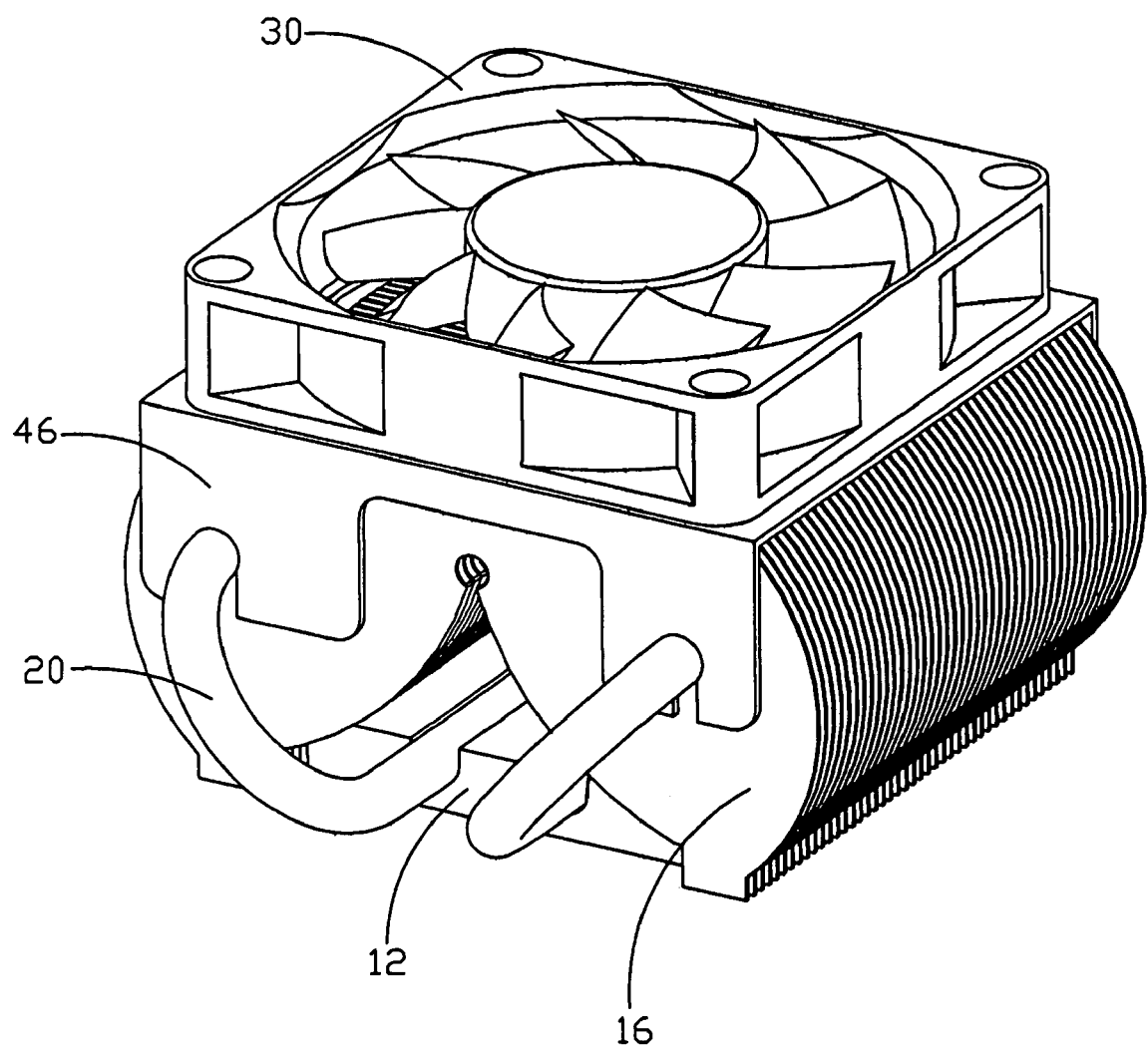
FIG. 2 is an assembled view of FIG. 1.

Referring to FIGS. 1–2, a heat dissipation device in accordance with the preferred embodiment of the present invention comprises a heat sink 10, a pair of heat pipes 20, a fan 30 and a fan holder 40.

The heat sink 10 comprises a base 12 for intimately contacting with a cool-waiting component (not shown) by a contact face, and having a flatly main face disposed opposing to the contact face and a plurality of side faces surrounding the contact face. The heat sink 10 further comprises a plurality of fins 16 spanning on the base 12. Each fin 16 forms a perpendicularly bent flange facing the base 12. The fins 16 are parallel to each other, and are arranged at substantially uniform intervals via the flanges formed therebetween. All of the perpendicularly bent flanges of the fins 16 define a continuous surface exposed to the base 12. The base 12 defines two parallel grooves 122 on the main face facing the fins 16. Two separate through holes 162 extend across the fins 16. The through holes 162 are parallel to the grooves 122. The through holes 162 are closer to the fan 30 than to the base 10.

Each heat pipe 20 comprises an evaporating section 22 and a condensating section 26 parallel to the evaporating section 22. The evaporating sections 22 of the heat pipes 20 are accommodated in the grooves 122 of the base 12, for transferring heat accumulated on the base 12 to the condensating section 26. The condensating sections 26 of the heat pipes 20 are engagingly inserted in the through hoes 162 of the fins 16, for releasing heat accumulated thereon to the fins 16 distant from the base 12.

The fan 30 defines positioning holes 32 therein.

The fan holder 40 covers the fins 16 and is disposed at an opposite side of the fins 16 relative to the base 12. The fan holder 40 comprises a support plate 42 and locating ears 46. The locating ears 46 extend perpendicularly from a pair of opposite edges of the support plate 42. The support plate 42 defines a central opening 422. The opening 422 communicates with an outlet (not labeled) of the fan 30 and an inlet (not labeled) of the heat sink 10. The support plate 42 further defines locking holes 426. The locking holes 426 are aligned with the positioning holes 32 of the fan 30. Screws or pins (not shown) pass through the positioning holes 32 of the fan 30, and further engage within the locking holes 426 of the fan holder 40, to thereby secure the fan 30 to the fan holder 40. The locating ears 46 are parallel to the fins 16. The locating ears 46 attach outmost fins 16 and sandwich all of the fins 16 therebetween. An engaging hole 462 is defined in each locating ear 46 for receiving a corresponding condensating section 26 of the heat pipes 20. A cutout 466 is defined at a free end of each locating ear 46, communicating with the engaging hole 462. The width of the cutouts 466 are smaller than the diameter of the engaging holes 462, and provide a guide way for having the condensating sections 26 to enter the engaging holes 462.

In assembly of the heat dissipation device, the heat pipes 20 are first secured into the through holes 162 of the heat sink 10. The fan holder 40 is then placed onto the heat sink 10 and is pressed. The condensating sections 26 of the heat pipes 20 enter the engaging holes 462 via the cutouts 466. Eventually, the locating ears 46 of the fan holder 40 grip the condensating sections 26 of the heat pipes 20 at the engaging holes 462. Thus, the fan holder 40 is mounted onto the heat sink 10 by means of the heat pipes 20.

It is practicable that the locating ears 46 merely define the engaging holes 462 without the cutouts 466. Under this circumstance, the fan holder 40 is first placed onto the heat sink 10. The condensating sections 26 of the heat pipes 20 respectively extend through the engaging holes 462 at one side of the heat sink 10, the through holes 162 of the fins 16, and the engaging holes 462 at an opposite side of the heat sink 10. As a result, the ears 46 grip opposite ends of the condensating sections 26 of the heat pipes 20, and thus the fan holder 40 is secured to the heat sink 10.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat dissipation device comprising:
   a heat sink comprising a base and a plurality of fins on the base;
   at least one heat pipe comprising a condensating section, the condensating section being secured to the fins and being distant from the base of the heat sink;
   a fan holder gripping the condensating section of the at least one heat pipe to retain the fan holder to the heat sink, the fan holder comprising a support plate for supporting the fan and ears perpendicularly extending from opposite sides of the support plate, each of the ears defining an engaging hole therein for engagingly receiving the condensating section of the at least one heat pipe; and
   a fan mounted onto the heat sink via the fan holder,
   wherein a cutout is defined in each of the ears, the cutout providing a guide way for having the condensating section to enter the engaging hole, the cutout having a width which is smaller than a diameter of the engaging hole.

2. The heat dissipation device of claim 1, wherein the ears are attached on outmost fins of opposite sides of the heat sink.

3. The heat dissipation device of claim 1, wherein the support plate of the fan holder is sandwiched between the fins and the fan.

4. The heat dissipation device of claim 3, wherein the support plate defines a central opening communicating with the fan and the heat sink.

5. The heat dissipation device of claim 1, wherein the base defines a groove therein, and wherein the at least one heat pipe comprises a vaporizing section received in the groove of the base.

6. A heat dissipation device comprising:
   a fin member;
   a fan;
   a fan holder comprising a support plate which is sandwiched between the fin member and the fan, and ears perpendicularly extending from the support plate; and
   at least one heat pipe comprising a condensating section, the condensating section extending across the fin member near the support plate and being gripped by the ears,
   wherein each of the ears defines an engaging hole therein for engagingly receiving the condensating section of the at least one heat pipe and a cutout is defined in each of the ears, the cutout providing a guide way for having the condensating section to enter the engaging hole, the cutout having a width which is smaller than a diameter of the engaging hole.

7. The heat dissipation device of claim 6, wherein the ears grip opposite ends of the condensating section.

8. The heat dissipation device of claim 6, wherein the ears are spaced from one side of the fin member opposing the fan.

9. A heat dissipation device comprising:
   a base attachable to a heat generating component by a contact face thereof to receive heat from said heat generating component, said base having a main face opposing to said contact face and at least one side face neighboring said contact face;
   a plurality of fin members extending from said base and a space formed between said main face of said base and plurality of fin members, each of said plurality of fin members having a heat transmittable contact with said at least one side face of said base;
   at least one heat-transmittable heat pipe comprising a section attached to said base and another section extending in and through each of said plurality of fin members; and
   a fan holder bearing a fan thereon and being attachable to said another section of said at least one heat pipe and spaced from said base, said fan holder comprising a support plate attachable to said plurality of fin members and ears perpendicularly extending from the support plate, said ears gripping said another section of said at least one heat-transmittable heat pipe to retain said fan holder to said plurality of fin members, each of said ears defining an engaging hole engagingly receiving said another section of said at least one heat-transmittable heat pipe.
   wherein each of said ears defines a cutout communicating with the engaging hole and said another section of said at least one heat-transmittable heat pipe is engagingly received in the engaging hole after moving through the cutout, the cutout having a width which is smaller than a diameter of the engaging hole.

* * * * *